(12) United States Patent
Cheng et al.

(10) Patent No.: US 9,006,071 B2
(45) Date of Patent: Apr. 14, 2015

(54) THIN CHANNEL MOSFET WITH SILICIDE LOCAL INTERCONNECT

(71) Applicant: International Business Machines Corporation, Armonk, NY (US)

(72) Inventors: Kangguo Cheng, Schenectady, NY (US); Bruce B. Doris, Slinerlands, NY (US); Ali Khakifirooz, Mountain View, CA (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 13/851,204

(22) Filed: Mar. 27, 2013

(65) Prior Publication Data
US 2014/0291734 A1    Oct. 2, 2014

(51) Int. Cl.
| H01L 21/336 | (2006.01) |
| H01L 21/28 | (2006.01) |
| H01L 29/417 | (2006.01) |
| H01L 29/66 | (2006.01) |
| H01L 29/78 | (2006.01) |

(52) U.S. Cl.
CPC .......... *H01L 21/28* (2013.01); *H01L 29/41725* (2013.01); *H01L 29/66477* (2013.01); *H01L 29/78* (2013.01)

(58) Field of Classification Search
CPC ................... H01L 21/823418; H01L 21/2257; H01L 21/28052

USPC .......... 257/377, 382, 384, 413, 576, E21.619; 438/300, 581, 630, 649, 655, 682
See application file for complete search history.

(56) References Cited

U.S. PATENT DOCUMENTS

| 5,306,667 | A |   | 4/1994  | Shappir |
| 5,313,084 | A |   | 5/1994  | Wei |
| 5,496,750 | A |   | 3/1996  | Moslehi |
| 5,760,451 | A | * | 6/1998  | Yu ................................. 257/382 |
| 6,157,068 | A |   | 12/2000 | Hashimoto et al. |
| 6,297,148 | B1 |  | 10/2001 | Besser et al. |
| 6,440,826 | B1 |  | 8/2002  | Buynoski |
| 7,091,071 | B2 |  | 8/2006  | Thean et al. |
| 8,415,748 | B2 | * | 4/2013 | Khater et al. ................. 257/384 |
| 2005/0202663 | A1 | | 9/2005 | Tsuchiaki |
| 2010/0304563 | A1 | | 12/2010 | Chan et al. |
| 2012/0025282 | A1 | * | 2/2012 | Doris et al. ................... 257/296 |
| 2012/0164807 | A1 | * | 6/2012 | Sun et al. ....................... 438/294 |
| 2014/0065819 | A1 | * | 3/2014 | Ahmed et al. ................ 438/664 |

* cited by examiner

*Primary Examiner* — Jarrett Stark
*Assistant Examiner* — Shahed Ahmed
(74) *Attorney, Agent, or Firm* — Steven M. Kellner; Yuanmin Cai (57) ABSTRACT

A semiconductor structure and method of manufacturing the same are provided. The semiconductor structure includes a semiconductor substrate having an isolated area comprising a first region and a second region. A first raised RSD region is formed in the first region and a second RSD region is formed in the second region. The first RSD region and second RSD region is separated laterally by a portion of the isolated area. A continuous silicide interconnect structure is formed overlying the first RSD region, the second RSD region and the portion of the isolated area situated between RSD regions. A contact may be formed on the surface of the silicide interconnect.

18 Claims, 9 Drawing Sheets

THIN CHANNEL MOSFET WITH SILICIDE LOCAL INTERCONNECT

FIELD OF THE INVENTION

The present invention relates generally to the fabrication of integrated circuits, and more particularly to a method of fabricating a silicide interconnect structure, and the structure formed thereby, on a thin channel metal-oxide-semiconductor field-effect transistor (MOSFET) device.

BACKGROUND

As integrated circuits become increasingly complex, the need for increased packaging density, reduced device parasitics, and low resistivity interconnects increases. Silicide local interconnects have been utilized to reduce pitch requirements, device parasitics, and interconnect resistances.

A common technique employed to form silicide interconnects in semiconductor manufacture is the self-aligned silicide ("salicide") process. The salicide process involves depositing a blanket layer of a refractory metal layer and amorphous silicon on the semiconductor. A masking resist layer is used to pattern the amorphous silicon. The resist is stripped, and an annealing step is then carried out to cause the refractory metal in contact with silicon to form a silicide. Selective etching is then used to remove the unreacted refractory metal. Often additional annealing is required to lower the resistivity of the silicide contacts.

During the resist stripping process, the refractory metal is exposed at regions not covered with the resist pattern. This can lead to the refractory metal becoming oxidized or thinned by plasma. The damaged metal film may inhibit the silicidation reaction and prevent the formation of a silicide of good quality and low resistance. In addition, monocrystalline silicon, such as the semiconductor substrate, is consumed faster than amorphous silicon during the silicidation process. The difference between the silicidation rates may lead to problems within the integrated circuit. Because the metal atoms are prone to rapidly diffuse into a silicon substrate, the metals can reach shallow junctions formed in source/drain regions and cause leakage at the junction.

Accordingly, it may be desirable to overcome the deficiencies and limitations described hereinabove.

SUMMARY

According to one embodiment of the present invention, a method for forming a thin channel MOSFET with silicide interconnect is provided. A method of forming a semiconductor device may include forming at least two isolation regions in a substrate to define an isolated area. A first raised source/drain (RSD) region and a second RSD region may be formed between the isolation regions; the first RSD region being laterally separated from the second RSD region by a portion of the isolated area. A continuous silicide interconnect may be formed overlying the first RSD region and the second RSD region, incorporating the portion of the isolated area situated between RSD regions.

According to another embodiment, the structure of a thin channel MOSFET with silicide interconnect is provided. A structure may include a semiconductor substrate having an isolated area comprising a first region and a second region, a first raised RSD region formed in the first region and a second RSD region formed in the second region separated laterally by a portion of the isolated area, and a continuous silicide interconnect structure overlying the first RSD region, the second RSD region and the portion of the isolated area situated between RSD regions.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description and drawings, details of well-known features and techniques may be omitted to avoid unnecessarily obscuring the presented embodiments.

The present invention relates generally to the fabrication of integrated circuits, and more particularly, to a structure and method for fabricating a silicide interconnect structure on a thin-channel MOSFET device. Local interconnects are used to minimize back end of the line ("BEOL") metallization density. However, commonly used bar contact interconnects lead to parasitic capacitance. Silicide interconnects provide good ohmic contact, reduce the sheet resistivity of source/drain regions, increase the effective contact area, and provide an etch stop.

Figure 1:
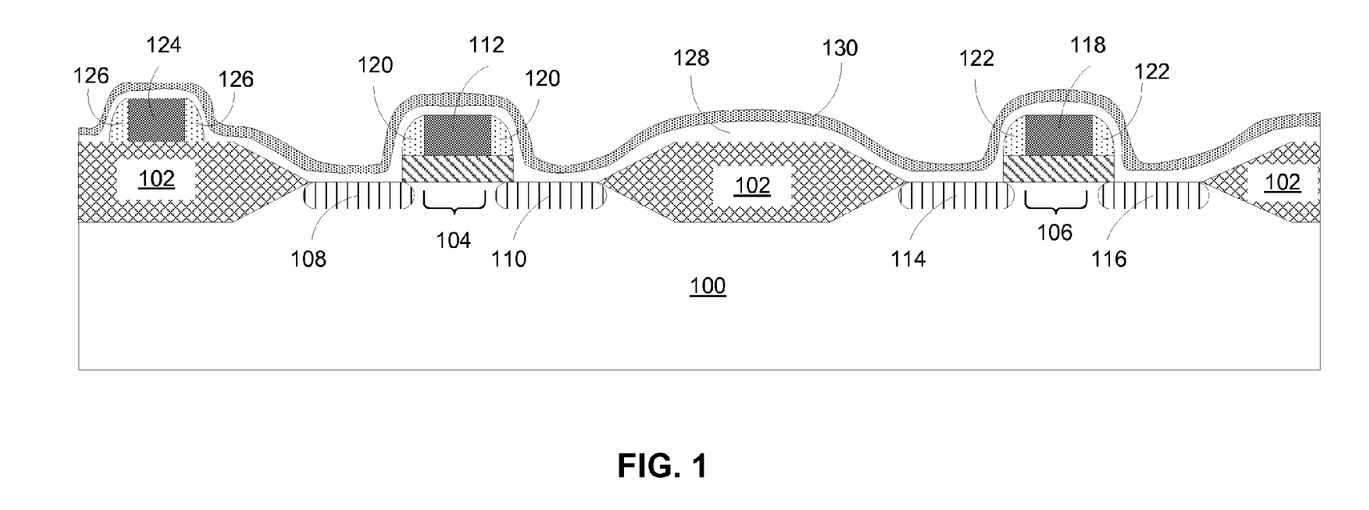
FIGS. 1-3 illustrate a conventional method of forming a silicide local interconnect wherein a refractory metal film and amorphous silicon film are deposited on the surface of the structure, the amorphous silicon film is patterned by selective etching, and the structure is annealed to form silicide.
Figure 2:
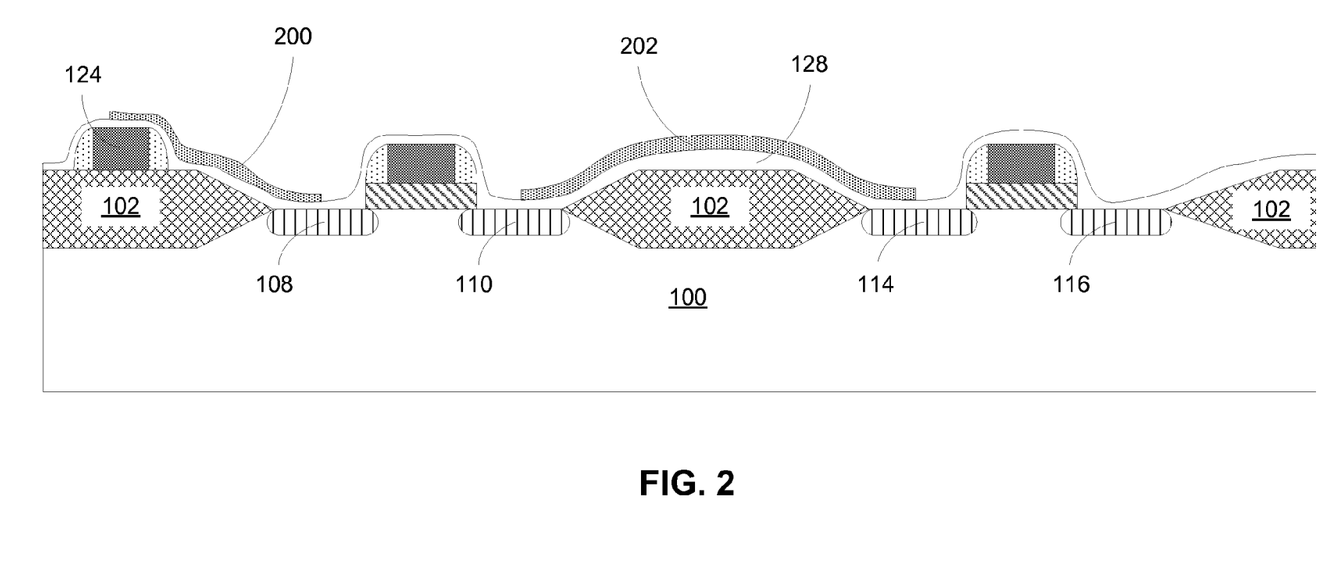
Figure 3:
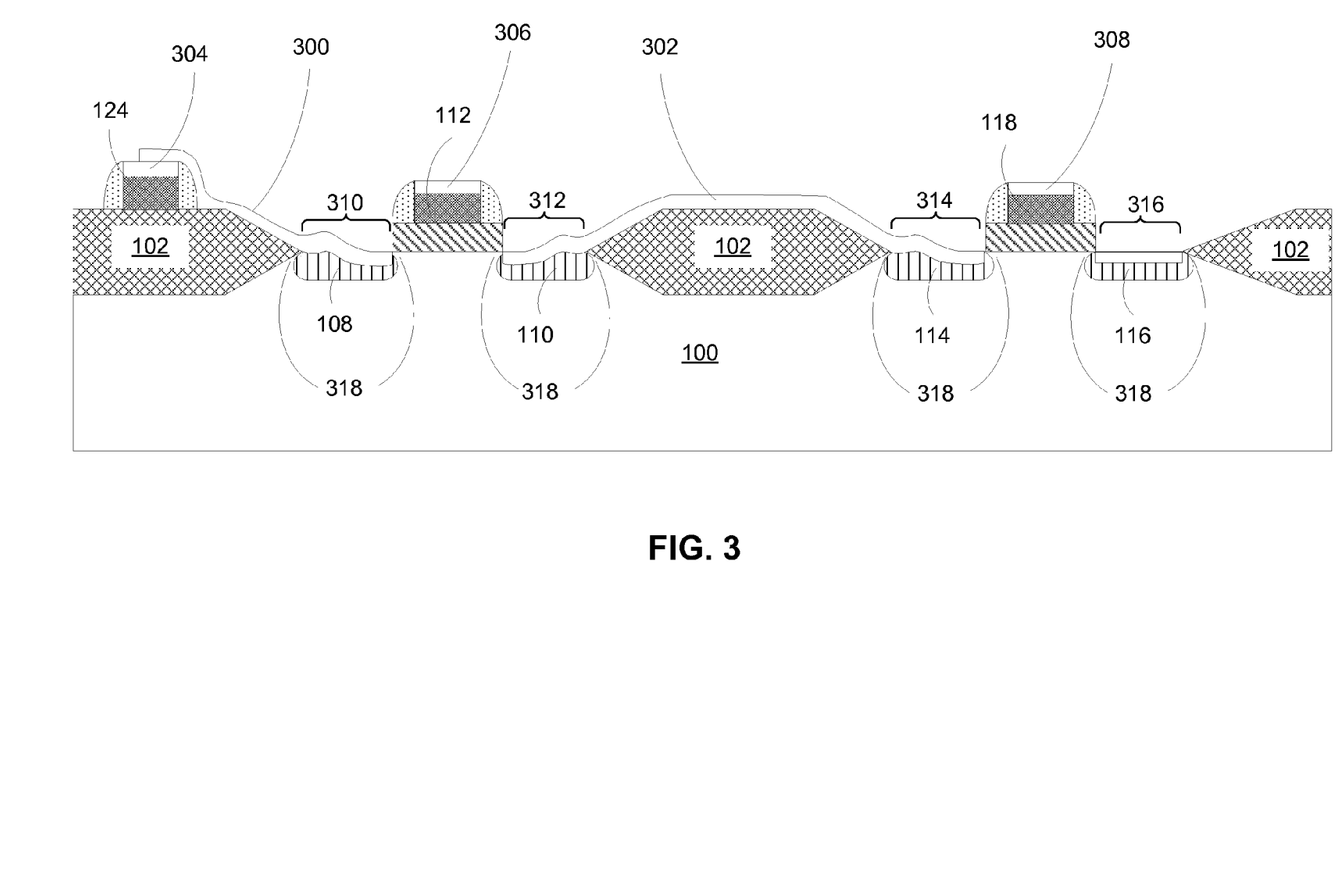

By the way of example, FIGS. 1 to 3 are cross sectional views of a semiconductor substrate illustrating a conventional method of forming local interconnects using self-aligned silicide (salicide) techniques.

Referring now to FIG. 1, on the surface of a silicon substrate 100, a field oxide film 102 is formed which defines active regions 104 and 106. In the active region 104 a MOSFET is formed having source/drain regions 108 and 110, and a gate electrode 112. In the active region 106 another MOSFET is formed having source/drain regions 114 and 116, and a gate electrode 118. On the side walls of gate electrodes 112 and 118, side wall insulators 120 and 122 are formed. A polysilicon wiring pattern, used as a contact, 124 is formed on the field oxide film 102 and side wall insulators 126 are formed on the walls thereof. A metal film 128 is formed over the whole surface of the substrate, and an amorphous silicon film 130 is formed on metal film 128.

Referring now to FIG. 2, the amorphous silicon film 130 (shown in FIG. 1) is partially etched to form amorphous silicon patterns 200 and 202 on the surface of the metal film 128. The silicon pattern 200 extends from the upper surface of the source/drain region 108 and over the field oxide film 102 to the upper surface of the polysilicon wiring pattern 124. The silicon pattern 202 extends from the upper surface of the drain region 110 of one MOSFET device, over the field oxide film 102, to the upper surface of the source region 114 of another MOSFET device. After the amorphous silicon film 130 is patterned, the device is annealed.

Referring now to FIG. 3, the metal film 128 (shown in FIG. 2) and the silicon surfaces in contact with the metal are subject to silicidation reaction so that a silicide layer is formed. The amorphous silicon patterns 200 and 202 (shown in FIG. 2) react with metal film 128 to form silicide layers 300 and 302. The upper surfaces of polysilicon wiring pattern 124 and gate electrodes 112 and 118 react with the metal film 128 and are silicidized to form regions 304, 306, and 308, respectively. The surfaces of source regions 108 and 114 and drain regions 110 and 116 also react with metal film 128 and are silicidized to form silicide regions 310, 312, 314, and 316.

With this conventional local interconnect formation method, the regions where the amorphous silicon patterns 200 and 202 are formed are covered with a resist pattern (not shown) to selectively etch the amorphous silicon film 130 (shown in FIG. 1). After this etching, the resist pattern used as the mask is removed by plasma or by dissolution with an etchant. During the resist removing process, the metal film 128 is in an exposed state at the region not covered with the resist pattern. Therefore, the exposed metal film 128 may be oxidized or thinned by plasma. The damaged metal film 128 may negatively impact the succeeding silicidation reaction.

In addition, monocrystalline silicon, such as the semiconductor substrate, is consumed faster than amorphous silicon during the silicidation process. This difference between the silicidation rates can lead to problems within the integrated circuit. Because the metal atoms are prone to rapidly diffuse into a silicon substrate during the silicide formation or in a subsequent step of heat treatment, the metal atoms can reach shallow junctions 318 formed in source/drain regions and cause leakage at the junctions 318.

Ideally, junction leakage, poor silicidation, and the need for a layer of amorphous silicon may preferably be reduced or eliminated for the reasons discussed above. One way to reduce junction leakage and the need for additional process steps of forming an amorphous silicon layer may include forming silicide interconnects on the surface of an extremely thin silicon-on-insulator (ETSOI) semiconductor substrate, also referred to as a fully-depleted silicon-on-insulator (FD-SOI) substrate according to embodiments of the present invention.

One exemplary embodiment by which to reduce junction leakage and the need for additional process steps of forming an amorphous silicon layer is described in detail below by referring to the accompanying FIGS. 4-9. In the present embodiment, raised source/drain regions are formed on the ETSOI layer of a substrate and the source/drain regions are silicided along with the isolated area of the ETSOI layer to form a silicide interconnect that is isolated from the semiconductor substrate. ETSOI is the preferred substrate and the various embodiments are illustrated using an ETSOI substrate, however the embodiments may also be applicable to a variety of substrates with a thin semiconductor layer isolated from the substrate including, but not limited to inFET, trigate, nanowire, or the like.

Figure 4:
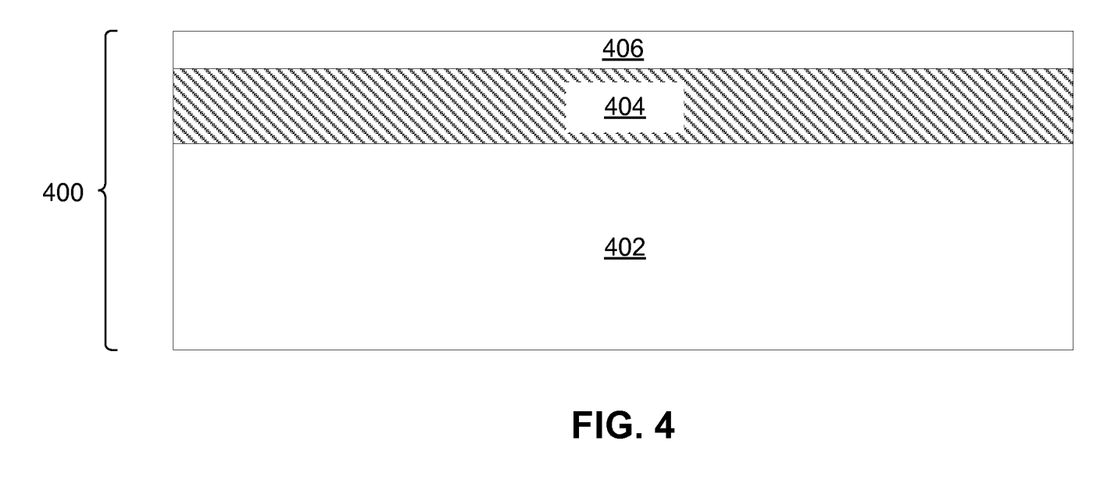
FIG. 4 is a vertical cross-sectional view of an extremely thin silicon-on-insulator (ETSOI) wafer, according to an embodiment of the present invention.

Referring now to FIG. 4, the isometric view of the ETSOI substrate 400 is shown. The base substrate 402 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Preferably, the base substrate 402 is a single crystal silicon wafer. Typically, the base substrate 402 may be approximately, but is not limited to, several hundred microns thick. For example, the base substrate 402 may have a thickness ranging from approximately 0.5 mm to approximately 1.5 mm.

As is shown, the ETSOI substrate 400 may also include a buried dielectric layer 404 formed thereon. The buried dielectric layer 404 may include any of several dielectric materials, for example, oxides, nitrides and oxynitrides of silicon. The buried dielectric layer 404 may also include oxides, nitrides and oxynitrides of elements other than silicon. In addition, the buried dielectric layer 404 may include crystalline or non-crystalline dielectric material. Moreover, the buried dielectric layer 404 may be formed using any of several known methods, for example, thermal or plasma oxidation or nitridation methods, chemical vapor deposition methods, physical vapor deposition methods, and the like. The buried dielectric layer 404 may have a thickness ranging from approximately 5 nm to approximately 200 nm.

A thin semiconductor layer 406 (herein referred to as ETSOI layer) is in turn formed over the buried dielectric layer 404. The ETSOI layer 406 may include any of the several semiconductor materials included in the base substrate 402. In general, the base substrate 402 and the ETSOI layer 406 may include either identical or different semiconducting materials with respect to chemical composition, dopant concentration and crystallographic orientation. The ETSOI layer 406 may be thinned to a desired thickness by planarization, grinding, wet etch, dry etch, oxidation followed by oxide etch, or any combination thereof. If the semiconductor layer is too thick, it may become difficult to form a silicide with adequate resistance. In an embodiment, the ETSOI layer 406 has a thickness ranging from approximately 2.0 nm to approximately 30.0 nm. In another embodiment, the ETSOI layer 406 has a thickness ranging from approximately 2.0 nm to approximately 10.0 nm. In a preferred embodiment, the ETSOI layer 406 has a thickness ranging from approximately 2.0 nm to approximately 7.0 nm.

Figure 5:
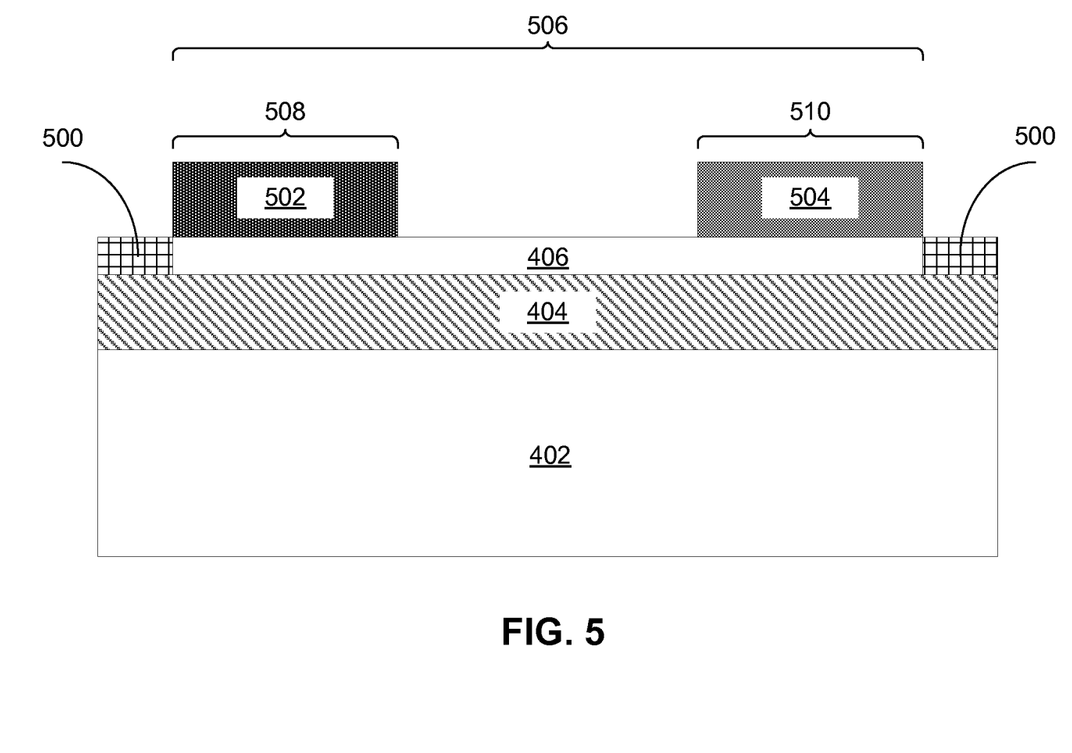
FIG. 5 is a vertical cross-sectional view of an ETSOI wafer after isolation regions and raised source/drain regions (RSD) have been formed, according to an embodiment of the present invention.

Referring now to FIG. 5, isolation regions 500 are formed on the ETSOI layer 406. The isolation regions 500 may utilize isolation technology, such as local oxidation of silicon (LOCOS), mesa isolation, or shallow trench isolation (STI), to define and electrically isolate the isolated area 506 from other regions of the ETSOI layer 406. In at least one embodiment, the isolation regions 500 include STI structures. In some embodiments, the isolation regions 500 may comprise silicon oxide, silicon nitride, silicon oxynitride, fluoride-doped silicate glass (FSG), a low-K dielectric material, other suitable materials, and/or combinations thereof. The isolation regions 500 may be formed by any suitable process. As one example, the formation of the STI may include pattering the ETSOI layer 406 by a conventional photolithography process, etching a trench in the ETSOI layer 406 (for example, by using a reactive ion etching process), and filling the trench with a dielectric material (for example, by chemical vapor deposition followed by chemical mechanical polishing). In some embodiments, the filled trench may have a multi-layer structure such as a thermal oxide liner layer filled with silicon nitride or silicon oxide.

The method continues with formation of raised source/drain (RSD) regions 502 and 504 on the isolated area 506 of the device. The RSD regions 502 and 504 may be formed in various ways. In a preferred embodiment, an epitaxial layer of, for example silicon or carbon doped silicon 502 is selectively formed over ETSOI layer 406 in the NFET region 508 of the isolated area 506. In one embodiment, the carbon concentration of the epitaxial carbon doped silicon layer 502 is less than 5%. During the epitaxy process that forms the RSD region 502, the PFET region 510 and the portion of the ETSOI layer 406 that is located between the NFET region 508 and PFET region 510 may be covered with a hardmask such as an oxide or nitride layer and subsequently removed. Similarly, an epitaxial layer of, for example, silicon germanium (SiGe) 504 is selectively formed over ETSOI layer 406 in the PFET region 510 of the isolated area 506. During the epitaxy process that forms the RSD region 504, the NFET region 508 and the portion of the ETSOI layer 406 that is located between the NFET region 508 and PFET region 510 may be covered with a hardmask such as an oxide or nitride layer and subsequently removed. In one embodiment, the PFET region 510 may be separated by approximately 30 nm to approximately 100 nm from the NFET region 508. Epitaxy is selective with respect to oxide and nitride, so there is no deposition on the isolation regions 500.

The RSD regions 502 and 504 may be doped with an appropriate dopant. For the RSD region 502 in the NFET region 508, a n-type dopant, such as phosphorus or arsenic may be used. For the RSD region 504 in the PFET region 510, a p-type dopant, such as boron may be used. Preferably, RSD regions 502 and 504 may be doped in situ by adding gases that contain the doping atoms such as $AsH_3$, $PH_3$, or $BH_3$ to the epitaxy gases. Alternatively, RSD regions 502 and 504 can be doped by plasma doping or ion implementation after the RSD regions 502 and 504 are formed. The portion of ETSOI layer 406 in the isolated area 506 between the NFET region 508 and PFET region 510 may be left undoped.

Figure 6:
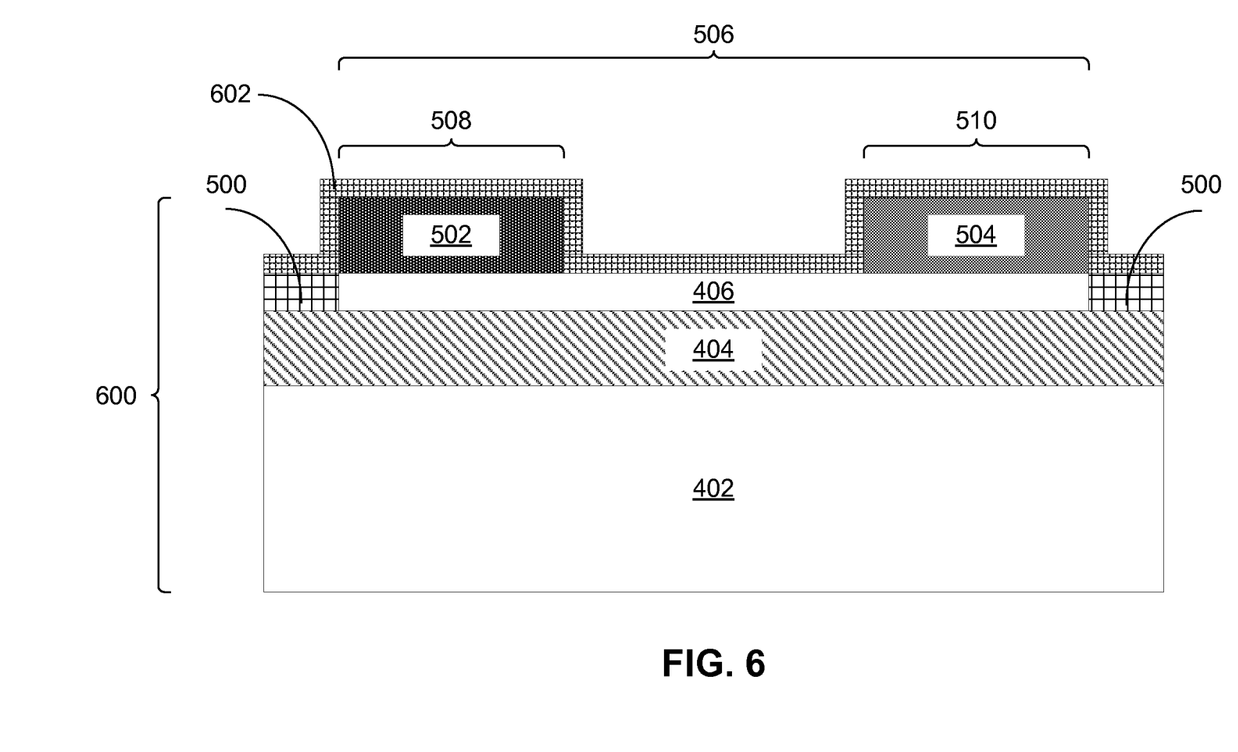
FIG. 6 is a vertical cross-sectional view of the ETSOI structure shown in FIG. 5 after a refractory metal film has been deposited on the surface of the ETSOI structure, according to an embodiment of the present invention.

Referring now to FIG. 6, a refractory metal layer 602 may be deposited uniformly over the entire structure 600 as shown in the figure. The refractory metal layer 602 may be formed using conventional deposition techniques including, but not limited to: chemical vapor deposition (CVD), plasma-assisted CVD, high-density chemical vapor deposition (HD-CVD), physical vapor deposition (PVD), plating, sputtering, evaporation, and chemical solution deposition. The deposition of the refractory metal layer 602 may be continued until an initial thickness of approximately 25 nm or less, preferably approximately 15 nm or less, even more preferably approximately 10 nm or less, is produced.

In one embodiment, the refractory metal layer 602 may include a nickel-platinum (NiPt) alloy. The refractory metal layer 602 may include a nickel concentration ranging from approximately 70 to approximately 95 atomic percent. Preferably, nickel may be present in the alloy in an amount ranging from approximately 90 to approximately 95 atomic percent. The remainder may be platinum and, if present, another metal. In one embodiment, the metal alloy layer 602 may include nickel palladium (NiPd), nickel rhenium (NiRe), titanium (Ti), titanium tantalum (TiTa), titanium niobium (TiNb), or cobalt (Co). Alternatively, other metals commonly employed in salicide processing such tantalum (Ta), tungsten (W), cobalt (Co), nickel (Ni), platinum (Pt), palladium (Pd), or alloys thereof may be employed.

After the refractory metal layer 602 is formed, an annealing step may be carried out at a temperature ranging from approximately 200° C. to approximately 500° C. using either a continuous heating regime or various ramp and soak heating cycles, for a duration ranging from approximately 1 second to approximately 1000 seconds. More preferably, the annealing step may be carried out at an annealing temperature ranging from approximately 200° C. to approximately 400° C. and for a duration ranging from approximately 5 seconds to approximately 500 seconds. Most preferably, the annealing step may be carried out at an annealing temperature ranging from approximately 250° C. to approximately 450° C. and for a duration from approximately 10 seconds to approximately 100 seconds. In one embodiment, the annealing step may be initiated by raising the surrounding temperature of the entire structure from ambient temperature to the desired annealing temperature at a ramp rate from approximately 1° C./second to approximately 35° C./second, more preferably from approximately 5° C./second to approximately 25° C./second, and most preferably from approximately 10° C./second to approximately 20° C./second. Further, it is preferred that the annealing step may be terminated by lowering the surrounding temperature of the entire structure to below 100° C. within a time period from approximately 10 seconds to approximately 1000 seconds.

The annealing step, as described above, may be generally referred to as a rapid thermal annealing (RTA) step. In another embodiment, a low temperature RTA step may be performed first at lower temperatures, for example from approximately 100° C. to approximately 350° C. The unreacted metal is stripped via an etching process and then a second RTA step is performed at the higher temperatures described above. The annealing process may be performed in an inert gas environment, which may include helium (He), argon (Ar), nitrogen ($N_2$), or another forming gas.

Figure 7:
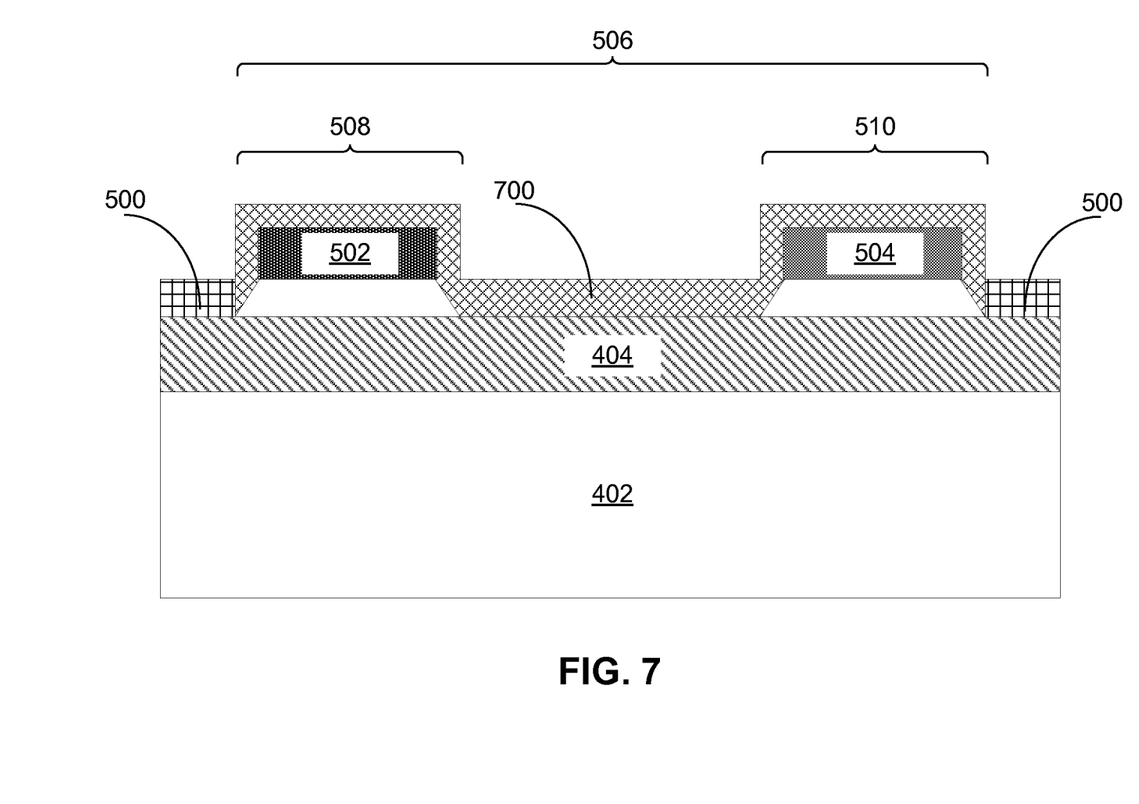
FIG. 7 is a vertical cross-sectional view of the ETSOI structure shown in FIG. 6 after a continuous silicide interconnect has been formed, according to an embodiment of the present invention.

Referring now to FIG. 7, as a result of the RTA step, the refractory metal layer 602 located on the surface of RSD regions 502 and 504 reacts with the silicon contained in the RSD regions and the single crystalline silicon in the ETSOI layer 406 of the isolated area 506 to form a continuous silicide interconnect 700. The continuous silicide interconnect 700 formed after the low-temperature RTA step, may extend into the silicon material of the RSD regions 502 and 504 and the single crystalline silicon in the ETSOI layer 406 approximately 3 nm to approximately 30 nm, with a depth from approximately 3 nm to approximately 20 nm being even more typical.

After the RTA step, an etching process may be carried out to remove substantially all un-reacted metal or metal alloy of the remaining portion of the refractory metal layer 602. The etching process does not remove silicide from the continuous silicide interconnect 700, therefore, leaving it substantially intact. In one embodiment, the etching process may be carried out by using an etching solution that contains one or more oxidizers such as, for example, sulfuric peroxide, hydrogen peroxide, sulfuric acid, potassium permanganate, hydrochloric acid, ferric chloride, persulfate (e.g., ammonium persulfate, sodium persulfate, or potassium persulfate), nitric acid, a ceric compound (such as, for example, ceric ammonium nitrate), or some combination thereof. In one embodiment, the etching process can be carried out using a solution that contains from approximately 1% to 30% by volume of hydrogen peroxide and from approximately 10% to approximately 90% by volume of sulfuric acid.

Figure 8:
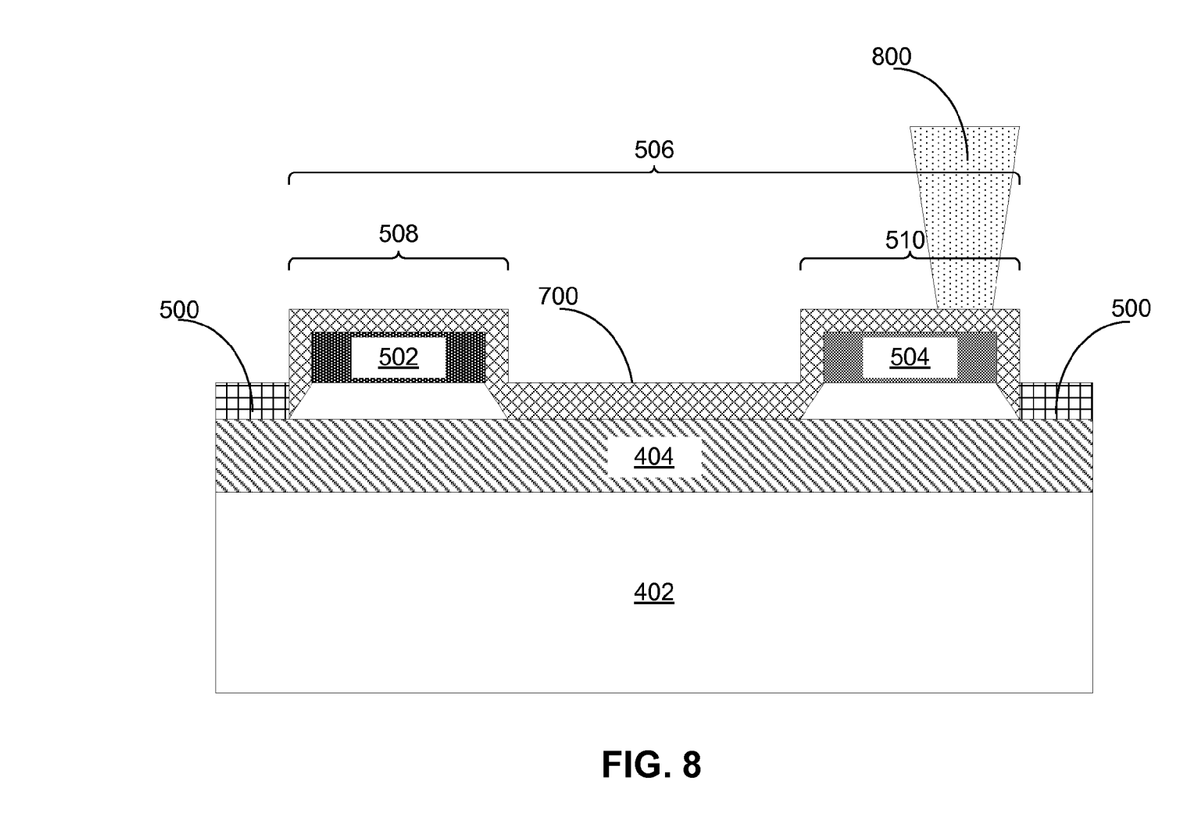
FIG. 8 is a vertical cross-sectional view of the ETSOI structure shown in FIG. 7 after a contact has been formed on the continuous silicide interconnect, according to an embodiment of the present invention.

Referring now to FIG. 8, electrical contacts (vertical contact vias) 800 may be formed on the surface of the continuous silicide interconnect 700. The formation may include the deposition of a dielectric material preferably with a low dielectric constant, such as, but not limited to silicon dioxide (SiO2). The dielectric material can be deposited by any suitable technique, including but not limited to, atomic layer deposition (ALD), molecular layer deposition (MLD), chemical vapor deposition (CVD), in-situ radical assisted deposition, metalorganic chemical vapor deposition (MOCVD), molecular beam epitaxy (MBE), physical vapor deposition, sputtering, plating, evaporation, ion beam deposition, electron beam deposition, laser assisted deposition, chemical solution deposition, or any combination of those methods. Contact vias may be defined with lithography and etched through the dielectric material with reactive-ion etching (RIE). The electrical contact 800 may be formed by filling the contact vias with a conductive material that includes, but is not limited to: tungsten, copper, aluminum, silver, gold, alloys thereof, and any suitable combination of those materials using any of the deposition methods listed above. Alternatively, a liner material that includes, but is not limited to titanium nitride (TiN), tantalum nitride (TaN), or ruthenium (Ru) may be first deposited on the walls of the contact via before filling the contact via with conductive material. After deposition, a planarization process such as chemical-mechanical planarization (CMP) may be performed to remove any contact material above the contact via.

Figure 9:
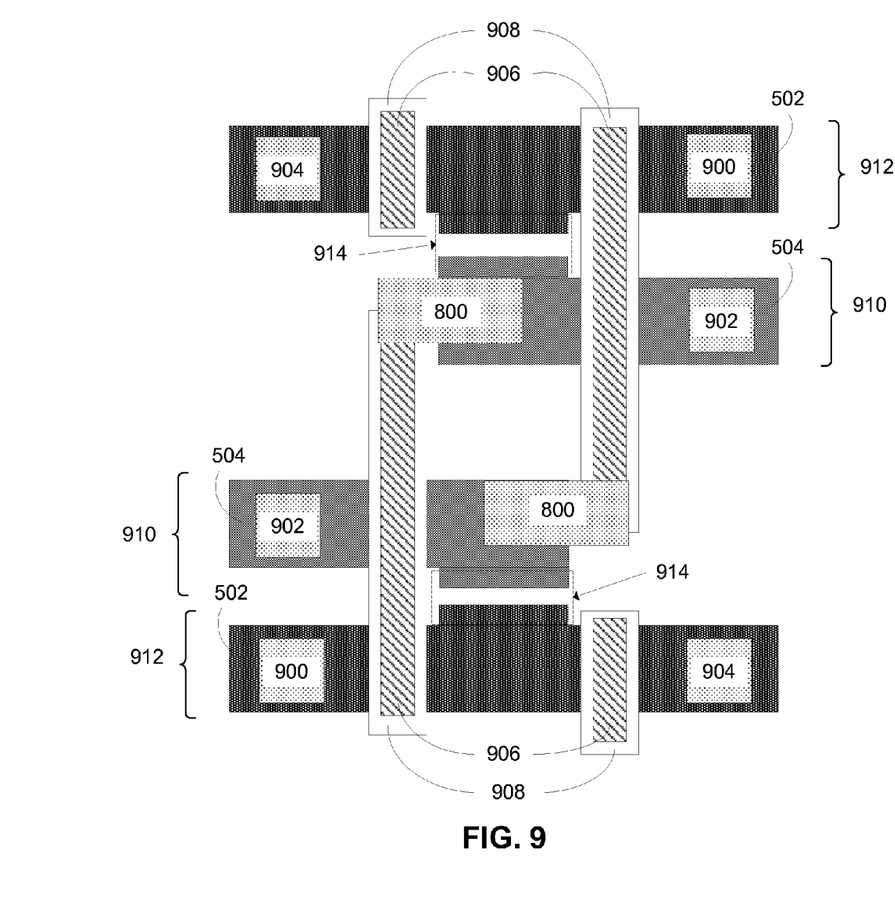
FIG. 9 is an overheard view of a static random-access memory (SRAM) cell illustrating a preferred embodiment of the present invention.

FIG. 9 shows a top view of a static random-access memory (SRAM) cell that is illustrative of a preferred embodiment of the present invention. Structures associated with a typical SRAM cell are present, such as: PFET regions 910, NFET regions 912, ground rail contacts 900, supply rail contacts 902, bit line contacts 904, word line contacts 906, and spacers 908. Silicide interconnect areas 914 demonstrate where a silicide local interconnect may be formed by disclosed method instead of conventional bar interconnects. Electrical contacts 800 may be formed over the silicide local interconnect to connect the silicide local interconnect to gates 906.

In a typical SRAM cell, local interconnects are used to contact the NFET region 912 and PFET region 910 and the gate of the other half cell. Similarly in logic cells, local interconnects are used to connect the drain region of NFET and PFET devices that form the output node of a logic cell. However, conventional bar interconnects result in higher parasitic capacitance and increase the space required between neighboring structures, thus reducing the device density.

The preferred embodiment of the present invention reduces the parasitic capacitance contribution from contact to gate in the output nodes of logic gates and also reduces the space required between neighboring devices imposed by the local interconnects in conventional SRAM and logic cells. In addition, the preferred embodiment of the present invention eliminates the necessity of depositing and patterning of amorphous silicon during the silicidation process to form a silicide local interconnect. This is advantageous because it reduces the number of process steps, and eliminates the damage caused to the refractory metal layer during the resist stripping process. Utilizing an ETSOI layer also eliminates the problem of junction leakage that is associated with common methods of forming silicide interconnects. It may be noted that not all advantages of the present invention are included above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming an interconnect structure, the method comprising:
   forming a first raised source/drain (RSD) region of a first transistor on a surface of a substrate and a second RSD region of a second transistor on the surface of the substrate, the first and second RSD regions being separated by a third region comprising a portion of the substrate; and
   forming a continuous electrical contact between the first RSD region and the second RSD region, the continuous electrical contact comprising a single silicide layer covering the first RSD region, the second RSD region, and the third region, wherein a substantial portion of the single silicide layer is below the surface of the substrate in the third region.

2. The method of claim 1, wherein the substrate is a semiconductor on insulator substrate having a semiconductor layer with a thickness ranging from 2.0 nm to 30.0 nm.

3. The method of claim 1, further comprising forming a contact on at least one of the horizontal surfaces of the continuous silicide.

4. The method of claim 1, wherein forming the continuous silicide comprises: depositing a metal film suitable for forming said continuous silicide on the first RSD region of the first transistor, the second RSD region of the second transistor, and the third region, and then causing the metal film to react with silicon underneath thereof in said regions by annealing the substrate.

5. The method of claim 4, wherein after said annealing the substrate, removing unreacted portions of the metal film through an etching process.

6. The method of claim 4, wherein the metal film comprises Ti, Ta, W, Co, Ni, Pt, Pd, Re, Nb, or alloys thereof.

7. The method of claim 4, wherein said annealing the substrate comprises subjecting the substrate to a temperature ranging from approximately 200 ° C. to approximately 500 ° C.

8. The method of claim 4, wherein said annealing the substrate comprises: first subjecting the substrate to a temperature ranging from approximately 100 ° C. to approximately 350 ° C., then removing unreacted metal through an etching process, and then subjecting the substrate to a temperature ranging from approximately 200 ° C. to approximately 500 ° C.

9. A method of forming an interconnect structure, comprising:
forming two isolation regions in a substrate to define an isolated area of the substrate between said isolation regions, the isolated area having a first region laterally separated from a second region by a third region;
forming a first raised source/drain (RSD) region of a first transistor in the first region of the isolated area and a second RSD region of a second transistor in the second region of the isolated area; and
forming a continuous electrical contact between the first RSD region and the second RSD region, the continuous electrical contact comprising a single silicide layer covering the first RSD region, the second RSD region, and the third region, wherein a substantial portion of the single silicide layer is below a top surface of the substrate in the third region.

10. The method of claim 9, wherein the substrate is a semiconductor on insulator substrate having a semiconductor layer with a thickness ranging from 2.0 nm to 30.0 nm.

11. The method of claim 9, further comprising forming a contact on at least one of the horizontal surfaces of the continuous silicide.

12. The method of claim 9, wherein forming the continuous silicide comprises: depositing a metal film suitable for forming said continuous silicide on the RSD region of the first transistor in the first region of the isolated area, the RSD region of the second transistor in the second region of the isolated area, and the third region of the isolated area, and then causing the metal film to react with silicon underneath thereof in said regions by annealing the substrate.

13. The method of claim 12, wherein after said annealing the substrate, unreacted portions of the metal film are removed through an etching process.

14. The method of claim 12, wherein the metal film comprises Ti, Ta, W, Co, Ni, Pt, Pd, Re, Nb, or alloys thereof.

15. The method of claim 12, wherein said annealing the substrate comprises subjecting the substrate to a temperature ranging from approximately 200 ° C. to approximately 500 ° C.

16. The method of claim 12, wherein said annealing the substrate comprises first subjecting the substrate to a temperature ranging from approximately 100 ° C. to approximately 350 ° C., then removing unreacted metal through an etching process, and then subjecting the substrate to a temperature ranging from approximately 200 ° C. to approximately 500 ° C.

17. The method of claim 1, wherein the first transistor and the second transistor comprise field effect transistors (FETs) having opposite carrier types.

18. The method of claim 9, wherein the first transistor and the second transistor comprise field effect transistors (FETs) having opposite carrier types.

* * * * *